(12) United States Patent
Shodo

(10) Patent No.: US 6,205,162 B1
(45) Date of Patent: Mar. 20, 2001

(54) SEMICONDUCTOR LASER DEVICE

(75) Inventor: Kenzo Shodo, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/046,485

(22) Filed: Mar. 23, 1998

(30) Foreign Application Priority Data

Mar. 27, 1997 (JP) .................................................. 9-075872

(51) Int. Cl.$^7$ ................................ H01S 3/00; H01S 5/00
(52) U.S. Cl. ................................................ 372/43; 372/38
(58) Field of Search ........................................ 372/43, 38

(56) References Cited

U.S. PATENT DOCUMENTS

| | | | |
|---|---|---|---|
| 4,506,151 | * 3/1985 | MacDonald et al. | 250/213 |
| 5,812,570 | * 9/1998 | Spaeth | 372/36 |
| 5,936,270 | * 8/1999 | Kamada | 257/291 |
| 5,991,134 | * 11/1999 | Tan et al. | 361/56 |

FOREIGN PATENT DOCUMENTS

4315581 A1 * 11/1994 (DE) .

* cited by examiner

*Primary Examiner*—Frank G. Font
*Assistant Examiner*—Armando Rodriguez
(74) *Attorney, Agent, or Firm*—Coudert Brothers

(57) ABSTRACT

A semiconductor laser device has a package which contains inside a laser diode which outputs light according to an applied voltage and a protective element. The protective element has a control terminal and is connected in parallel with the laser diode, and its impedance is significantly smaller than that of the laser diode when no voltage is applied to the control terminal and is significantly larger when a specified voltage is applied to the control terminal. The protective element may be a depletion mode FET connected in parallel with the laser diode between its drain and source, its gate serving as the control terminal. A photoelectric conversion IC for converting a received light signal into an electrical signal may also be contained inside the package and containing the protective element.

2 Claims, 1 Drawing Sheet

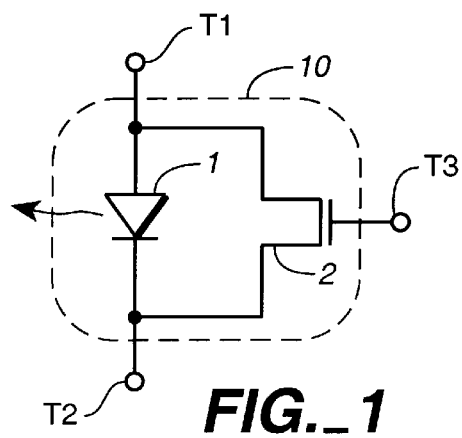
FIG._1
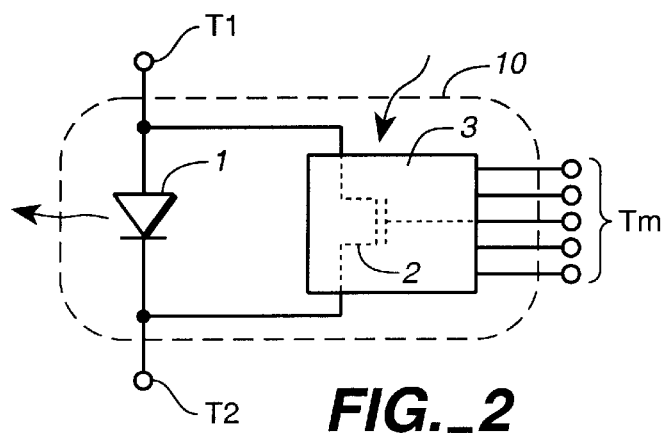
FIG._2
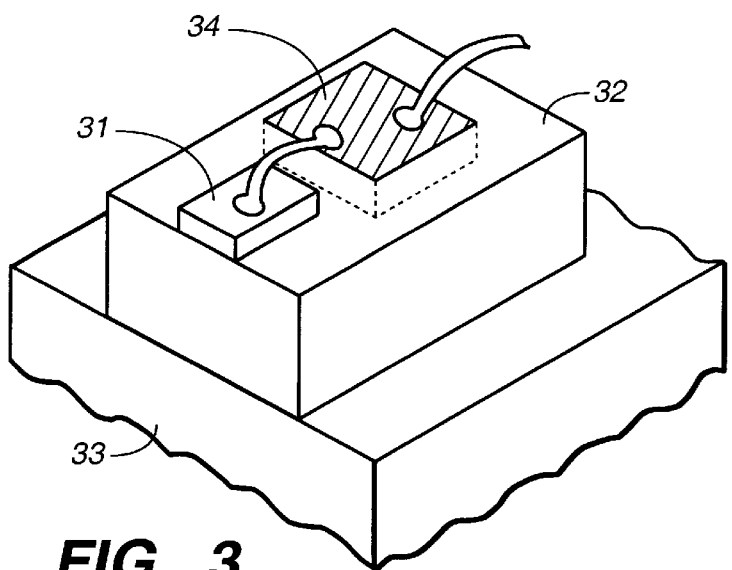
FIG._3
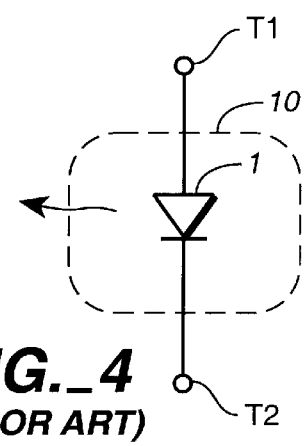
FIG._4
(PRIOR ART)

SEMICONDUCTOR LASER DEVICE

BACKGROUND OF THE INVENTION

This invention relates to a semiconductor laser device which may be contained in a compact disc player or an optical pickup.

FIG. 4 shows the circuit structure of a prior art semiconductor laser device of this kind with a laser diode 1 contained inside a package 10, connected through wires or lead lines to its terminals $T_1$ and $T_2$ outside for applying a voltage thereacross and thereby providing an optical output according to the applied input voltage.

While there is no source voltage being applied to such a circuit, it sometimes happens that the static electricity of the circuit causes a current (referred to as "a surge current") to flow through, thereby degrading or destroying the diode because laser diodes are typically much more fragile than ordinary ICs against a surge current.

Since prior art semiconductor laser devices are structured such that the surge current would completely flow into the laser diode, the laser diode is easily degraded or destroyed. In other words, prior art semiconductor laser devices had only a very low resistance against surge currents.

It was necessary therefore to take an adequate measure when a prior art semiconductor laser device was installed in its driving circuit, for example, in order to prevent such degradation or destruction of the laser diode by a surge current. If a circuit for absorbing the surge current is to be attached externally, however, this will increase the total area of the set into which the semiconductor laser device is incorporated.

SUMMARY OF THE INVENTION

It is therefore an object of this invention to provide a semiconductor laser device with improved resistance against surge currents.

A semiconductor laser device embodying this invention, with which the above and other objects can be accomplished, may be characterized as comprising a package containing therein both a laser diode for outputting light according to a voltage applied thereto and a protective element having a control terminal. The protective element is connected in parallel with the laser diode, and its impedance is significantly smaller (say, by one order of magnitude or more) than that of the laser diode when no voltage is applied to the control terminal but is significantly larger (say, by one order of magnitude or more) when a specified voltage is applied to the control terminal. The protective element may be a depletion mode FET of which the drain and the source are connected in parallel with the laser diode and of which the gate serves as the control terminal.

According to a preferred embodiment of the invention, a photoelectric conversion IC for converting a received light signal into an electrical signal is also contained in the same package, containing the protective element therein. Since the photoelectric conversion IC has many terminals, one of them may be used as the control terminal for the protective element. This embodiment is particularly advantageous in the case of a device such as a compact disc player and an optical pickup which requires the existence of a photoelectric conversion IC because its production process can be thereby simplified. The laser diode may be mounted on a base plate which also contains the protective element or the photoelectric conversion IC. A device thus structured is particularly easy to handle, for example, when the operation of the laser diode is checked during the production process.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1 is a circuit diagram of a semiconductor laser device according to a first embodiment of this invention;

FIG. 2 is a circuit diagram of another semiconductor laser device according to a second embodiment of this invention;

FIG. 3 is a diagonal view of the internal structure of a package of the semiconductor laser devices of FIGS. 1 and 2; and FIG. 4 is a circuit diagram of a prior art semiconductor laser device.

Throughout herein, like components are indicated by the same numeral and are not necessarily explained repetitiously.

DETAILED DESCRIPTION OF THE INVENTION

The invention will be described next by way of examples with reference to the drawings.

FIG. 1 shows the circuit structure of a semiconductor laser device according to a first embodiment of the invention characterized as comprising a p-channel depletion mode FET 2 (serving as a protective element) of which the drain and the source are connected in parallel inside a package 10 with a laser diode 1 connected to terminals T1 and T2 outside the package 10. The gate of the FET 2 is connected to another terminal (referred to as the control terminal) T3 also outside the package 10.

FIG. 2 shows the circuit structure of another semiconductor laser device according to a second embodiment of the invention characterized as comprising a photoelectric conversion IC 3 which serves to convert a received optical signal into an electrical signal and contains a p-channel depletion mode FET 2. Inside a package 10, the drain and the source of this p-channel depletion mode FET 2 are connected in parallel with a laser diode 1 between external terminals $T_1$ and $T_2$. A plurality of terminals $T_m$ outside the package 10 are connected to the photoelectric conversion IC 3, and the gate of the p-channel depletion mode FET 2 is connected to one of these external terminals $T_m$.

In both of these circuits shown in FIGS. 1 and 2, the p-channel depletion mode FET 2 serves such that the impedance between its drain and its source increases as the voltage between its gate and its source becomes larger. When the gate-source voltage is zero, it is in the ON condition between its drain and its source but it is in the OFF condition between the drain and the source when the gate-source voltage exceeds a certain threshold voltage value. Thus, when the semiconductor laser device of FIG. 1 or 2 is standing by itself or may be incorporated in a driving circuit but if no voltage is being applied to the control terminal of the depletion mode FET 2, no surge current will flow into the laser diode 1 because the laser diode 1 is short-circuited by the depletion mode FET 2. If these semiconductor laser devices are incorporated in a driving circuit and a specified voltage is applied to the control terminal of the depletion mode FET 2, on the other hand, the laser diode 1 is released from the short-circuited condition. As a result, a specified voltage is applied to the laser diode 1 and the emission of laser light becomes possible.

Since a photoelectric conversion IC has many terminals, there may be situations wherein the ON/OFF conditions of a depletion mode FET contained thereby can be controlled by using one of the terminals of photoelectric conversion IC. In this way, the present invention may have the merit of preventing the total number of terminals from increasing too much. The total number of terminals can be reduced if the application of voltage to the laser diode 1 can be effected through terminals of the photoelectric conversion IC 3.

Another advantage of the second embodiment described above is that it contains a photoelectric conversion IC within the same package such that when the laser device is used for a compact disc or an optical pickup, the total production process can be simplified and the overall size can be reduced.

The interior of the package 10 shown in FIGS. 1 and 2 may be structured as shown in FIG. 3 wherein numeral 31 indicates a laser diode chip, numeral 32 indicates a base plate (which may be referred to as "the sub-mounting structure"), numeral 33 indicates a heat sink and numeral 34 indicates a circuit-forming area on the base plate 32. The laser diode chip 31 comprising the laser diode 1 (of FIG. 1 or 2) is attached by die bonding to the base plate 32 which is sufficiently larger than itself dimensionally, and the base plate 32 itself is attached to the heat sink 33 by die bonding. The depletion mode FET 2, in the case of the first embodiment of the invention shown in FIG. 1, and the photoelectric conversion IC 3, in the case of the second embodiment of the invention shown in FIG. 2, is mounted to the circuit-forming area 34 on the base plate 32, and connections are made by wire bonding to the chip 31 of the laser diode 1 and wires or lead lines which extend to the exterior of the package 10 (not shown in FIG. 3) such that the circuit structure as shown in FIG. 1 or 2 can be formed. The cathode side of the laser diode 1 is connected to the circuit on the circuit-forming area 34 through the base board 32.

Operations of a laser diode are usually checked in the form of a chip but the handling of such a chip is very difficult. If a laser diode is incorporated in a semiconductor laser device as described above, however, the chip 31 of the laser diode 1 can be tested after it has been attached to the base plate 32 by die bonding and hence the testing can be carried out much more easily.

The base plate 32 need not serve only to improve the handling of the laser diode. It can be used more efficiently by forming a circuit such as the depletion mode FET 2 or the photoelectric conversion IC 3 inside.

The examples described above are not intended to limit the scope of the invention. Many modifications and variations are possible within the scope of the invention. For example, an n-channel depletion mode FET may be used in the place of the p-channel depletion mode FET 2 in FIG. 1 or 2. In such a case, a negative voltage is applied to the control terminal.

Neither is the method of driving the semiconductor laser devices described above intended to limit the scope of the invention. When starting the emission of a laser light, the supply of a specified voltage to the control terminal of the protective element may be stopped after the application of a voltage is started to the both terminals of the laser diode. For stopping the emission of the laser light, the application of voltage to the laser diode may be stopped after the supply of the specified voltage to the protective element. In this manner, the flow of a surge current to the laser diode can be more dependably prevented.

As explained above, unless a voltage is applied to the control terminal, hardly any surge current will flow into the laser diode of the semiconductor laser device according to the first or second embodiment of this invention. Thus, this invention serves to improve the durability against surge currents. Moreover, there is required no additional circuit for absorbing surge currents and the area of the circuit for the set incorporating the semiconductor laser device can be reduced.

If a photoelectric conversion IC is used as the protective element, furthermore, it is possible to prevent the total number of terminals from increasing too much because a photoelectric conversion IC usually has many terminals, some of them can be used as the control terminal for the protective element and the input of a voltage to the laser diode.

What is claimed is:

1. A semiconductor laser device comprising:

a laser diode which is mounted on a base plate and outputs light according to an applied voltage;

a depletion mode FET having a drain serving as a control terminal, a source and a gate, said depletion mode FET being formed in said base plate and connected in parallel with said laser diode between said drain and said source, said depletion mode FET having a smaller impedance than said laser diode by at least one order of magnitude when no voltage is applied to said control terminal and having a larger impedance than said laser diode by at least one order of magnitude when a specified voltage is applied to said control terminal; and a package which contains both said laser diode and said depletion mode FET.

2. The semiconductor laser device of claim 1 further comprising a photoelectric conversion IC for converting a received light signal into an electrical signal, said photoelectric conversion IC being contained inside said package and containing said protective element.

* * * * *